United States Patent
Shen et al.

(10) Patent No.: US 6,977,396 B2
(45) Date of Patent: Dec. 20, 2005

(54) HIGH-POWERED LIGHT EMITTING DEVICE WITH IMPROVED THERMAL PROPERTIES

(75) Inventors: Yu-Chen Shen, Sunnyvale, CA (US); Daniel A. Steigerwald, Cupertino, CA (US); Paul S. Martin, Pleasanton, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 0 days.

(21) Appl. No.: 10/369,714

(22) Filed: Feb. 19, 2003

(65) Prior Publication Data

US 2004/0160173 A1 Aug. 19, 2004

(51) Int. Cl.[7] .............................................. H01L 33/00
(52) U.S. Cl. ........................... 257/100; 257/98; 257/99
(58) Field of Search ........................ 257/98–100, 720, 257/737, 744, 745

(56) References Cited

U.S. PATENT DOCUMENTS

| | | | |
|---|---|---|---|
| 5,998,232 A | 12/1999 | Maruska | |
| 6,333,522 B1 * | 12/2001 | Inoue et al. | 257/99 |
| 6,455,878 B1 | 9/2002 | Bhat et al. | 257/99 |
| 6,486,499 B1 | 11/2002 | Krames et al. | 257/81 |
| 6,498,355 B1 | 12/2002 | Harrah et al. | |
| 6,514,782 B1 | 2/2003 | Wierer, Jr. et al. | |
| 6,614,058 B2 * | 9/2003 | Lin et al. | 257/99 |
| 2004/0012958 A1 * | 1/2004 | Hashimoto et al. | 362/241 |
| 2004/0222434 A1 * | 11/2004 | Uemura et al. | 257/99 |

FOREIGN PATENT DOCUMENTS

WO    WO 02/05350 A1    1/2002

OTHER PUBLICATIONS

European Search Report, 3 pages.

* cited by examiner

*Primary Examiner*—Donghee Kang
(74) *Attorney, Agent, or Firm*—Patent Law Group LLP (57) ABSTRACT

A light emitting device includes a first semiconductor layer of a first conductivity type, an active region, and a second semiconductor layer of a second conductivity type. First and second contacts are connected to the first and second semiconductor layers. In some embodiments at least one of the first and second contacts has a thickness greater than 3.5 microns. In some embodiments, a first heat extraction layer is connected to one of the first and second contacts. In some embodiments, one of the first and second contacts is connected to a submount by a solder interconnect having a length greater than a width. In some embodiments, an underfill is disposed between a submount and one of the first and second interconnects.

23 Claims, 9 Drawing Sheets

FIG. 5

HIGH-POWERED LIGHT EMITTING DEVICE WITH IMPROVED THERMAL PROPERTIES

BACKGROUND

1. Field of Invention

The present invention relates to high-powered light emitting diodes, more particularly to improving the thermal properties of high-powered light emitting diodes with flip-chip architecture.

2. Description of Related Art

Light emitting diodes ("LEDs") are solid-state light sources with multiple advantages. They are capable of providing light with high brightness reliably and thus find applications in displays, traffic lights, and indicators, among others. An important class of light emitting diodes is fabricated from one or more Group III elements, such as gallium, indium, or aluminum, and the group V element of nitrogen. These "III-nitride" LEDs are capable of emitting light in the green, blue, or even ultraviolet regime of the spectrum, and thus have many promising applications. Other suitable materials systems for fabrication of light emitting diodes include the III-phosphide, III-arsenide and II-VI materials systems.

LEDs are often fabricated by epitaxially depositing an n-type region, an active region and a p-type region on a substrate. Contacts, typically metal, are formed on the n-type region and the p-type region. During operation, the contacts provide current to the n- and p-sides of the device. In some types of devices, for example III-arsenide devices, the growth substrate is often removed after growth, an n-contact is deposited on the exposed n-type region, and a p-contact is deposited on the p-type region. In other types of devices, a portion of the active region and the p-type region are etched away, exposing a portion of the n-type region. The p-contact is formed on the remaining portion of the p-type region and the n-contact is formed on the exposed portion of the n-type region, such that both contacts are formed on the same side of the device. In such a device, the light may be extracted from the device through the contacts or through the side of the device without the contacts. Devices that extract light through the contacts are generally disfavored because in order to provide enough current to the device, the typically metal contacts must be thick enough that they are essentially opaque. Devices that extract light through the side of the device without the contacts are referred to as flip chips. III-nitride devices are often grown on sapphire substrates and included in devices in flip chip configuration.

In general, as the amount of current provided to the device increases, more electrons and more holes are provided to the active region, resulting in more photons being emitted. In III-nitride devices however, as the current density increases, eventually efficiency decreases, then failure mechanisms such as cracking of the sapphire substrate or the device layers are observed.

SUMMARY

In accordance with embodiments of the invention, a light emitting device includes a first semiconductor layer of a first conductivity type, an active region, and a second semiconductor layer of a second conductivity type. First and second contacts are connected to the first and second semiconductor layers. In some embodiments at least one of the first and second contacts has a thickness greater than 3.5 microns. In some embodiments, a first heat extraction layer is connected to one of the first and second contacts. In some embodiments, one of the first and second contacts is connected to a submount by a solder interconnect having a length greater than a width. In some embodiments, an underfill is disposed between a submount and a growth substrate.

The thickness, area, and materials used in the first and second contacts, the heat extraction layer, the solder interconnect, and the underfill may be selected to reduce the average temperature and temperature gradient in the device.

DETAILED DESCRIPTION

Figure 1:
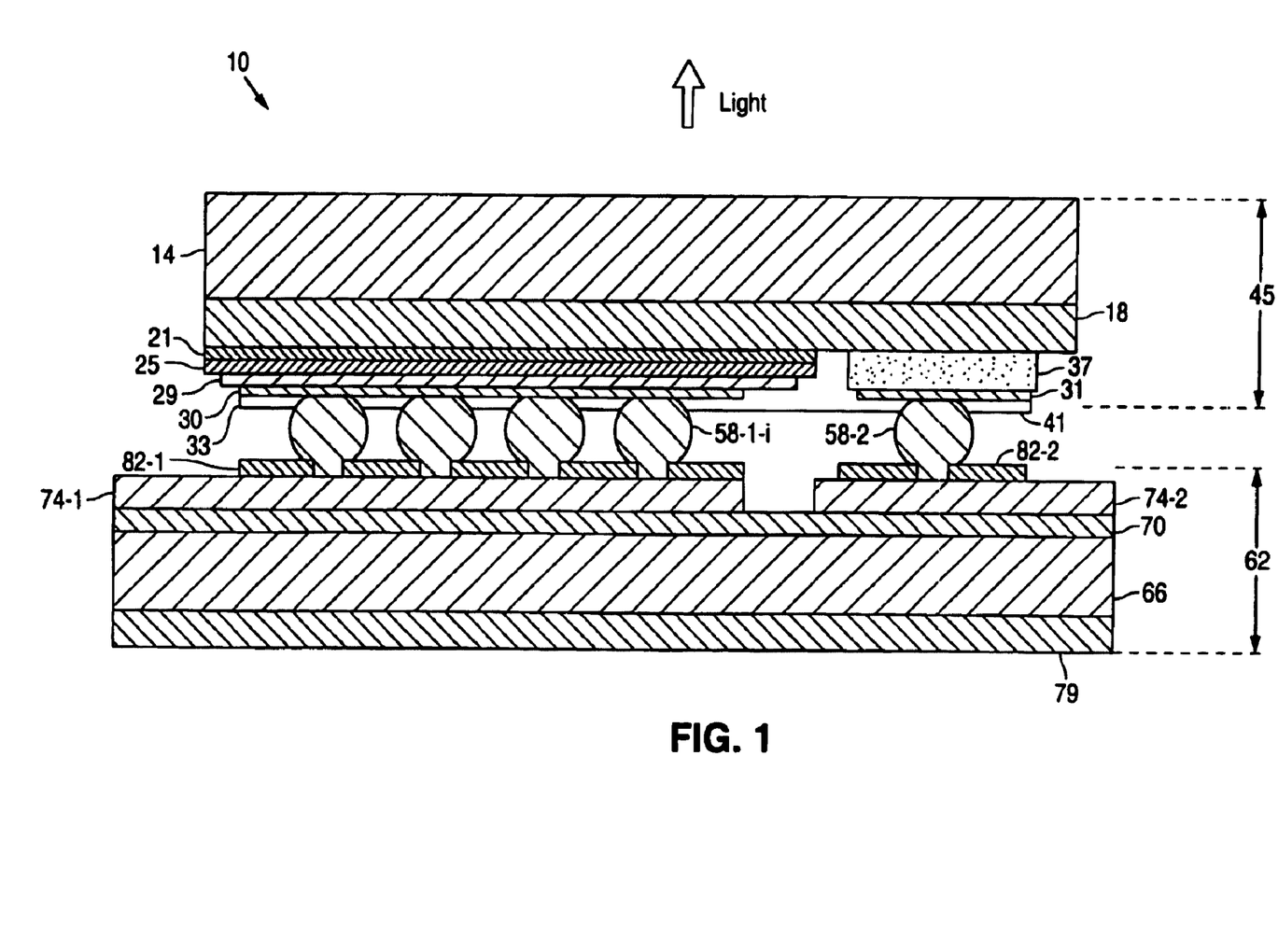
FIG. 1 illustrates a flip chip light emitting diode.

FIG. 1 illustrates a III-nitride flip chip light emitting device according to embodiments of the present invention. Aspects of the flip chip design illustrated in FIG. 1 are described in more detail in U.S. Pat. No. 6,486,499, issued Nov. 26, 2002, titled "III-Nitride Light-Emitting Device With Increased Light Generating Capability," and incorporated herein in its entirety by this reference. In flip chip 10, die 45 is manufactured, then flipped and mounted on submount 62 such that light is extracted from the device through growth substrate 14. The manufacture of the flip chip light emitting diode 10 starts with the die 45. Die 45 is manufactured initially by epitaxially depositing semiconductor material on a substrate by molecular beam epitaxy, metal-organic chemical vapor deposition, or any other suitable epitaxial technique. Metals are then deposited and patterned on the semiconductor material to form contacts. An interconnect material is then used to connect the submount 62 to die 45.

Substrate 14, such as sapphire, SiC, GaP, or GaAs, is chosen to have a high index of refraction and transparency to the selected wavelength of light, as well as suitable crystal growing properties. Deposited on substrate 14 is first semiconductor region 18, active region 21, and second semiconductor region 25. In first semiconductor region 18, active region 21, and second semiconductor region 25, group III elements, for example gallium, and group V elements, for example nitrogen, are deposited substantially simultaneously. Aluminum and indium are added in these semiconductor layers to engineer the band structure. First semiconductor region 18 may be n-doped with an n-type dopant, such as silicon, and second semiconductor region 25 may be p-doped with a p-type dopant, for example magnesium. Each of regions 18 and 25 may contain multiple layers of the same or different composition, thickness, and dopant concentration.

Active region 21 generally contains multiple quantum wells (MQW) which are capable of generating light through radiative recombination of electrons and holes. The quantum wells of active region 21 are designed to provide spatial confinement of the electrons and holes, thus enhancing the efficiency of the LED.

A first contact 29 is formed overlying second semiconductor region 25. The functions of first contact 29 include providing electrical contact to second semiconductor layer 25. First contact 29 can be formed using metals, metal alloys and metal oxides. First contact 29 can include several layers of various thickness and layout. A first solderable layer 30 is deposited and patterned to form a contact with the solder 58-1-$i$. A dielectric (such as spin-on-glass, SOG) 33 is deposited partially overlying first solderable layer 30. Dielectric 33 is formed with several openings to accommodate electrical contacts. The functions of dielectric 33 include providing electrical insulation for first contact 29 and holding solder balls in place. The thickness of dielectric 33 may be between about 0.03 micron and about 3 microns.

A second contact 37 is formed by etching away a portion of first contact 29, second semiconductor layer 25 and active region 21. Second contact 37 is then formed directly over the cleared portion of first semiconductor region 18. The functions of second contact 37 include providing an electrical contact for first semiconductor region 18. Second contact 37 can be formed using metals, metal alloys, and metal oxides. A second solderable layer 31 is deposited over contact 37 and patterned. The second solderable layer is used as a contact layer to the solder ball 58-2. A dielectric 41 is deposited partially overlying second solderable layer 31. Dielectric 41 has openings for accommodating electrical contacts. The functions of dielectric 41 include providing electrical insulation for second contact 37. The thickness of dielectric 41 may be between about 0.03 micron and about 3 microns. Dielectric 33 and dielectric 41 can be the same dielectric layer.

As illustrated in FIG. 1, a submount structure 62 includes a $SiO_2$ layer 70, a Si layer 66, and a solderable layer 79. Bonding pads 74-1 and 74-2 are deposited overlying semiconductor oxide layer 70, corresponding to first contact 29 and second contact 37, respectively. Bonding pads 74-1 and 74-2 can be formed, for example, from aluminum or silver. Insulating layers 82-1 and 82-2 are formed overlying bonding pads 74-1 and 74-2 with openings to accommodate solder balls. Insulating layers 82-1 and 82-2 can be formed, for example, from alloys of silicon and nitrogen. Circuitry or other additional features may be included within or attached to submount 62 in order to enable enhanced functionality. For example, Zener diodes maybe included for protection from electrostatic discharge (ESD).

Die 45 is electrically and physically connected to submount 62 using solder balls 58-1-$i$ and solder ball 58-2. Solder ball 58-2 provides an electrical contact to second contact 37 through solderable layer 31, and solder balls 58-1-$i$ provide electrical contact to first contact 29 through solderable layer 30. A suitable choice for the material of solder balls 58-1-$i$ and solder ball 58-2 is, for example, a PbSn alloy. Though FIG. 1 illustrates four solder balls connecting contact 29 to the submount and one solder ball connecting contact 37 to the submount, more or fewer solder balls may be used with contact 29 and more solder balls may be used with contact 37. Solder balls 58-1-$i$ and solder ball 58-2 are soldered into the openings of dielectric layers 33 and 41 of die 45 and into the openings of insulating layers 82-1 and 82-2 of submount structure 62.

The device illustrated in FIG. 1 generally has an area of about one square millimeter and is conventionally operated at a current less than 350 mA, which corresponds to 50 $A/cm^2$. At current densities less than 50 $A/cm^2$, the structure illustrated in FIG. 1 demonstrates an acceptably long operating lifetime. Operating the device 1 at currents of 1 A–3 A, corresponding to a current density of 143 $A/cm^2$, is desirable as it is expected to generate more light than operation at less than 50 $A/cm^2$; however, at current densities greater than 143 $A/cm^2$, the devices illustrated in FIG. 1 fail after an unsuitably short amount of time.

The inventors have discovered the presence of unexpectedly large temperatures and temperature gradients within the device illustrated in FIG. 1, which cause the previously unexplained failures at current densities greater than 50 $A/cm^2$.

When a voltage bias or current is applied to LED 10, electrons from the n-doped region and holes from the p-doped region are introduced to the active region where they recombine. Radiative recombination generates light. Defects in the crystal structure of the semiconductor layers in the device can result in non-radiative recombination of electrons and holes, which generates heat. Heat is also generated by current flow through the contacts and semiconductor layers in the device of FIG. 1. The heat generated by current flow and non-radiative recombination causes the average temperature of the die to increase. An increase in the average temperature in the die may lead to a decrease of the confinement of carriers in the active region, reducing the recombination rates and hence the efficiency of the LED, and may cause the materials in contacts 29 and 37 or in the semiconductor layers to diffuse into other parts of the device, resulting in device failure.

In addition, the small ratio of the area of solder balls 58-1-$i$ and 58-2 to the area of die 45 cause extremely large temperature gradients. Large temperature gradients can generate mechanical strain within the substrate and the semiconductor layers, which can lead to the cracking of the die.

For example, modeling of device 10 demonstrated that operation of device 10 at a current density of about 50 $A/cm^2$ with a forward voltage of 3.7 V may generate a temperature gradient of 80 K/mm. Operation of device 10 at a current of about 143 $A/cm^2$ with a forward voltage of 3.7 V may generate a temperature gradient of about 200 K/mm, much higher than the gradient at 50 $A/cm^2$.

In accordance with embodiments of the invention, the temperature and temperature gradients are reduced in devices by adding structures and materials to the device that conduct heat out of the device. In various embodiments, temperatures and thermal gradients within the device may be reduced by designing metal and substrate layers within the device to maximize dissipation of heat, by adding metal layers to the device to maximize dissipation of heat, by designing interconnect layers to maximize dissipation of heat, and by filling air gaps within the device with materials that dissipate heat. Particularly good thermal gradient reduction can be achieved by forming thick thermally conductive layers that allow enough distance for heat to travel laterally to the solder as it travels vertically through the die. Embodiments of the invention may be used in large junction devices, i.e. devices with an area greater than one square millimeter, or in small junction devices, i.e. devices with an area less than one square millimeter.

In accordance with embodiments of the invention, using one or more of the techniques described above, the thermal resistance per area of the device, defined as the change in temperature divided by the corresponding change in power and the area, is reduced to below 10 $K/W\text{-}mm^2$. In some embodiments, the temperature gradient is reduced to below 30 K/mm.

Figures 4A, 6:
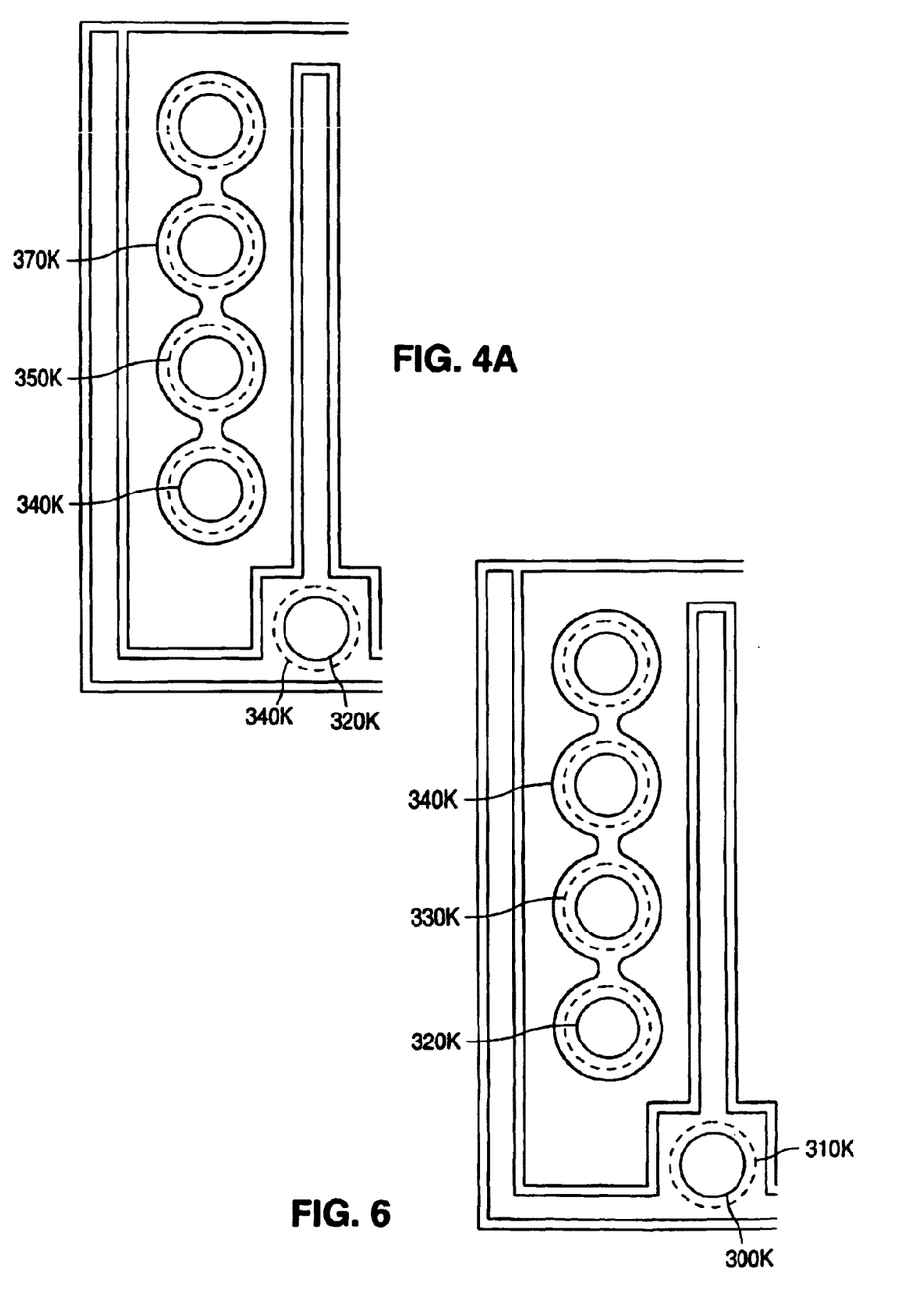
FIGS. 4A and 4B illustrate temperature contours of devices connected to submounts with solder balls and solder bars.
FIG. 6 illustrates an embodiment with reduced average temperature and temperature gradients.

In some embodiments, the thermal resistance of die 45 in FIG. 1 can be reduced by selecting the thickness, area, and materials that form first contact 29 and second contact 37 to maximize heat dissipation. First contact 29 and second contact 37 may be a single layer of uniform composition, or may include multiple layers of the same or different composition. For example, first contact 29 and second contact 37 may include an ohmic layer, a reflective layer, a guard layer, and a heat extraction layer. Increasing the thickness of first contact 29 and second contact 37 from about 0.2 micron to about 10 microns may lower the temperature and temperature gradients within the device. FIG. 4A illustrates temperature contours in semiconductor layer 18 in a device with 0.2 micron thick contacts 29 and 37, and FIG. 6 illustrates temperature contours in semiconductor layer 18 in a device with 10 micron thick contacts 29 and 37. As illustrated in FIGS. 4A and 6, the maximum temperature expected in semiconductor layer 18 is 370 K in a device with 0.2 micron thick contacts, and only 340 K in a device with 10 micron thick contacts. Thus, increasing the thickness of the contacts lowers the maximum temperature rise from ambient of first semiconductor layer 18 from about 70 K to about 40 K, when the device is generating 3.7 W of heat. Increasing the thickness of first contact 29 and second contact 37 may also decrease the temperature gradient at a predefined location. The temperature gradient in the region immediately adjacent to the solder balls is about 40 K for a device with 0.2 micron contacts, and only about 20 K for a device with 10 micron contacts. In some embodiments, the thickness of at least one of first contact 29 and second contact 37 is greater than 3.5 microns.

The amount of heat dissipated by the device may be further reduced by increasing the area of contacts 29 and 37, or by using metals with high thermal conductivity within first and second contact layers 29 and 37. Advantageous choices of metals include Ag, Al, Au, and Cu.

In some embodiments, the material used for substrate 14 is selected to have high thermal conductivity in order to dissipate heat. One example of a substrate with suitable growth properties and high thermal conductivity is silicon carbide.

Figure 2:
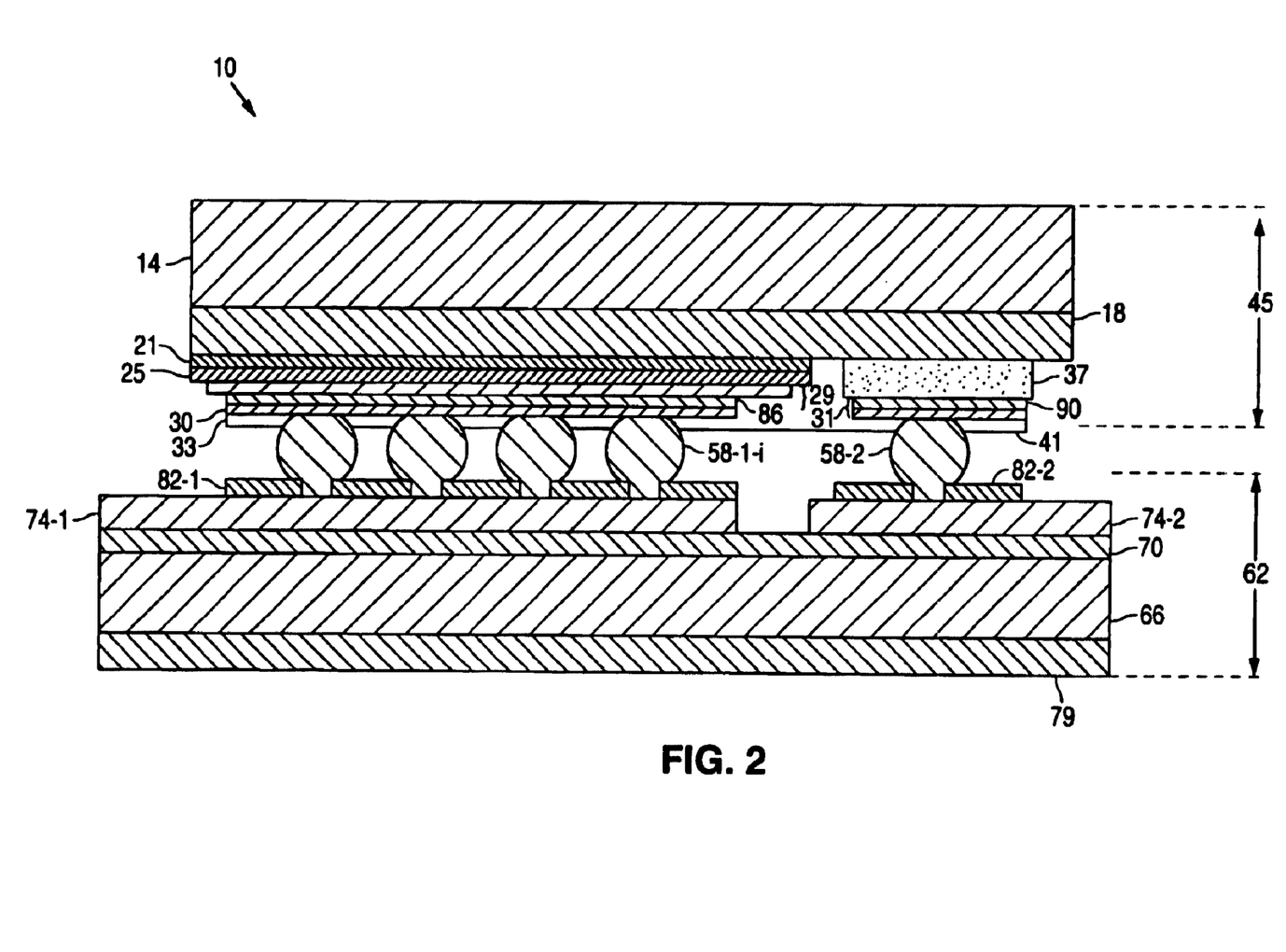
FIG. 2 illustrates a light emitting diode with additional layers providing improved heat extraction.

FIG. 2 illustrates an embodiment of the invention where at least one of the contacts includes a heat extraction layer. In a device similar to that illustrated in FIG. 1, a first heat extraction layer 86 is formed as part of first contact 29 adjacent to solderable layer 30, and a second heat extraction layer 90 is formed as part of second contact 37 adjacent solderable layer 31. The thickness, area, and material of first and second heat extraction layers 86 and 90 are selected to spread the heat generated in the device to reduce the temperature and temperature gradients within regions 18, 21, and 25, and act as heat sinks to withdraw heat from within the device. First and second heat extraction layers 86 and 90 may be metals with high thermal conductivity, such as Al (thern-al conductivity about 240 W/m-K), Cu (thermal conductivity about 390 W/m-K), or Au (thermal conductivity of about 310 W/m-K), Ni, V, or stacks of multiple metals. In general, the larger the area and thickness of first and second heat extraction layers 86 and 90, the better the heat extraction properties. Heat extraction layers with thicknesses greater than about 0.2 micron can give rise to favorable thermal properties. In some embodiments, first and second heat extraction layers have a thickness of 3.5 microns or more. In some embodiments, a favorable reduction of the thermal resistance and of the temperature gradient at a predefined location can be achieved if the area of first and second heat extraction layers 86 and 90 is greater than about 20% of the area of first semiconductor layer 18.

Since first and second heat extraction layers 86 and 90 are good heat conductors, the device illustrated in FIG. 2 conducts heat away from die 45, thereby reducing the thermal resistance of die 45. For example, in a device according to FIG. 2 where heat extraction layers 86 and 90 are 10 microns of Al, the average temperature rise from the ambient temperature (298 K) of die 45 decreases by about 38% compared to the average temperature rise of die 45 in a device according to FIG. 1 without heat extraction layers 86 and 90. If the heat generated in die 45 is 3.7 W, the average temperature rise from ambient of first semiconductor layer 18 in a device according to FIG. 1 without first and second heat extraction layers 86 and 90 may be about 65 K. In contrast, in a device according to FIG. 2 with first and second heat extraction layers 86 and 90 of the above composition and thickness, the average temperature rise of first semiconductor layer 18 may be about 40 K.

Furthermore, the lowest temperature rise from ambient to a temperature in die 45 generally occurs in the area above second contact 37, mostly because active layer 21 has been etched away, thus no heat generating recombination is taking place in the region above second contact 37. This lowest temperature rise is approximately the same in the architectures of FIGS. 1 (with 0.2 micron contacts) and FIG. 2. However, the maximum temperature is smaller in the embodiment of FIG. 2, which lowers the average temperature. Since the minimum temperature remains the same, the temperature variations and thus the temperature gradients at predefined locations are smaller in the embodiment of FIG. 2. In general, temperature gradients below 30 K/mm are considered desirable.

Figure 3A:
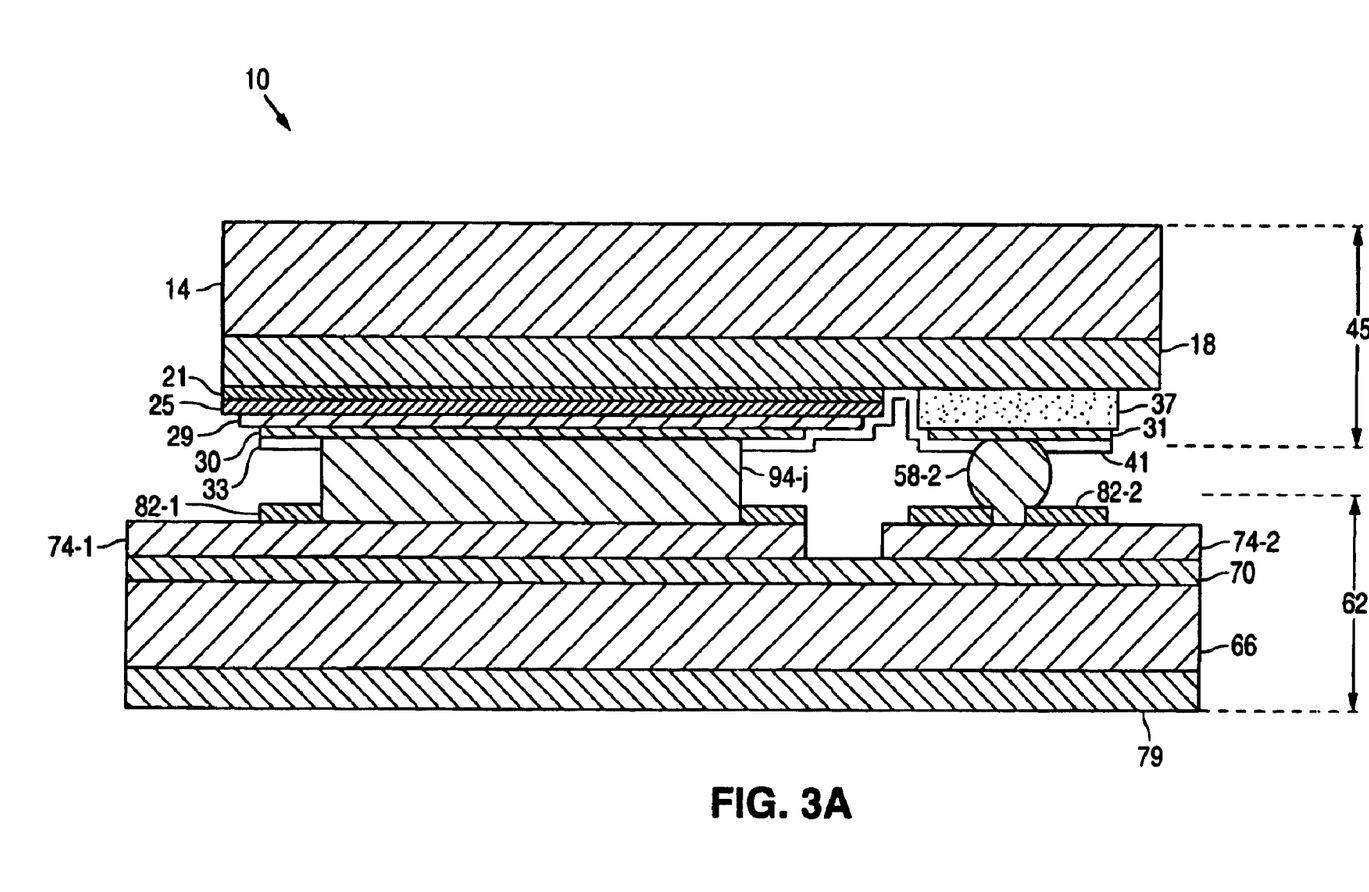
FIGS. 3A, 3B, 3C, and 3D illustrate embodiments utilizing solder bars.
Figure 3B:
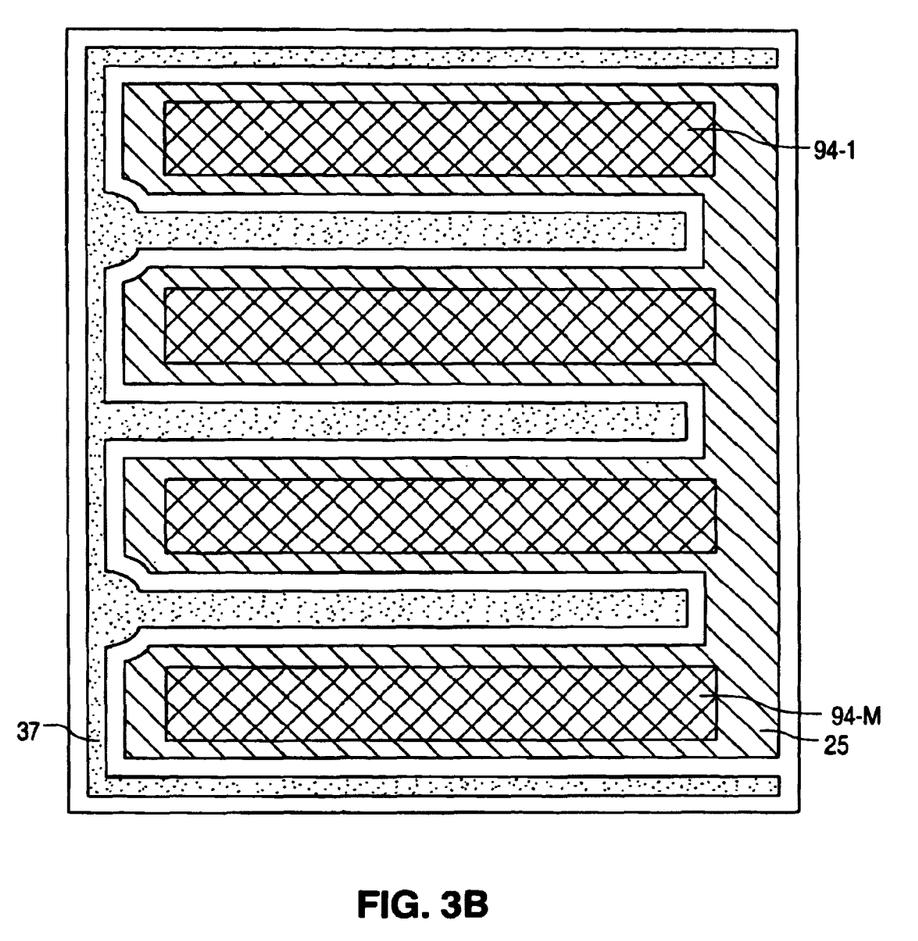
Figure 3C:
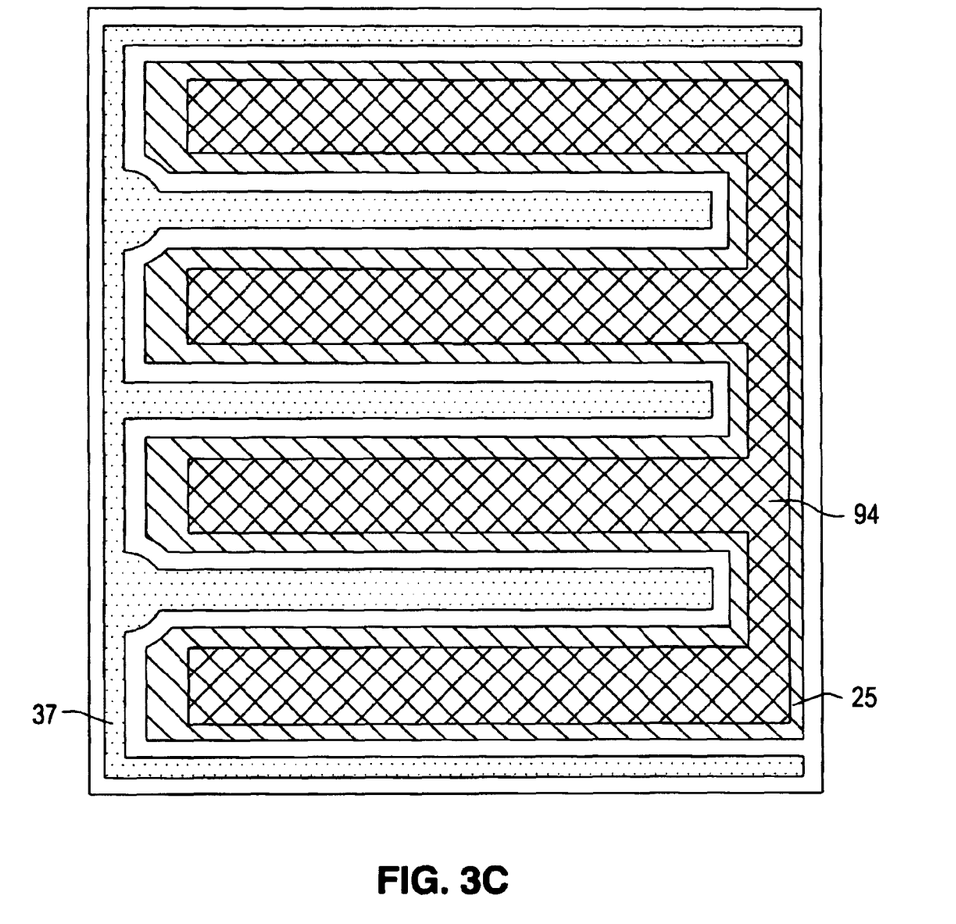
Figure 3D:
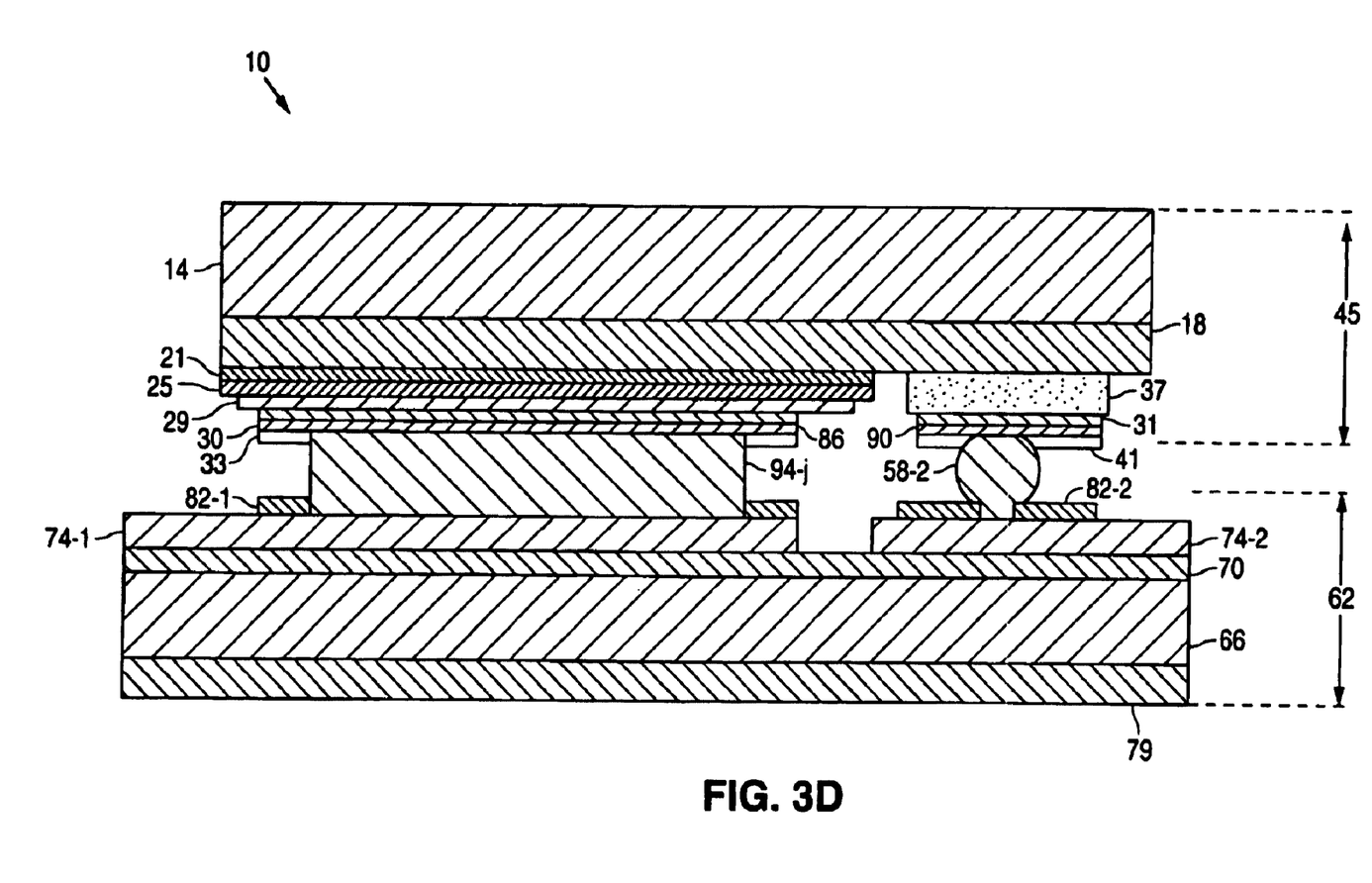

FIGS. 3A–D show embodiments of the invention where solder balls 58-1-$i$ and solder ball 58-2 of FIG. 1 are replaced by solder bars 94-j, in order to increase the area of the interconnect between die 45 and submount 62 to dissipate more heat. FIG. 3A shows a side view, while FIG. 3B shows a top view of the embodiment. Devices may have more or fewer solder bars than are illustrated in FIG. 3B. FIG. 3C shows the top view of another embodiment, where the solder bars are connected to form one extended solder bar 86. Enlargement of the interconnect area decreases the average temperature, as well as the temperature gradients at predefined locations within die 45. In the embodiment illustrated in FIG. 3D, the solder bars of FIGS. 3A–C are used in combination with the heat extraction layers 86 and 90 of FIG. 2.

In some embodiments, the solder used in the solder bars is selected for high thermal conductivity, in order to maximize heat extraction through the solder. Materials that have the necessary mechanical and chemical properties and have high thermal conductivity include, for example, In, Sn, and the alloys of $Pb_xSn_{100-x}$ and $Ag_xIn_{100-x}$, wherein x can range between zero and hundred, and is preferably about 3.

Figure 4B:
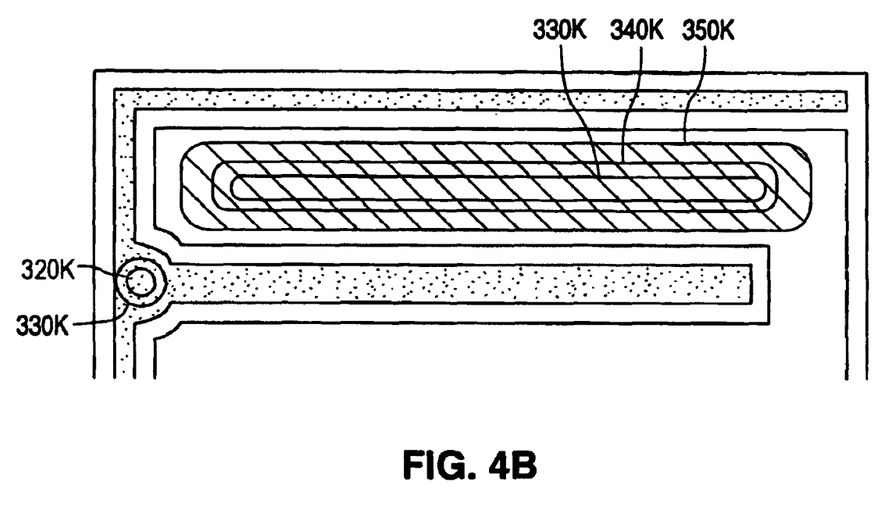

FIGS. 4A and 4B illustrate temperature gradients in portions of device with solder balls and with solder bars, respectively. As illustrated in FIG. 4A, solder balls form a contact with die 45 only in limited areas. The shape of these areas are usually approximately circular. FIG. 4A also illustrates the temperature variations within first semiconductor layer 18 of die 45, when the device is connected to a heat sink of about 300 K, operating at 1 A, and generating 3.7 W of heat. Temperature contours corresponding to 320 K, 340 K, 350 K, and 370 K are identified. As shown, the temperature of first semiconductor layer 18 can vary between about 320 K and 370 K. In fact, a large fraction of the die area has temperatures in the vicinity of 370 K. As is clear from FIG. 4A, the temperature within semiconductor layer 18 is lowest in the vicinity of contact areas with solder. The temperature gradients within the device illustrated in FIG. 4A are steep around the areas of contact with solder balls 58-1-i and solder ball 58-2. These steep temperature gradients can give rise to failure mechanisms such as cracking due to increased mechanical strains and unwanted change of chemical composition.

The structure and operating conditions of the device illustrated in FIG. 4B are the same as the device illustrated in FIG. 4A, except that FIG. 4A's solder balls are replaced with solder bars in FIG. 4B. As illustrated, the larger contact area of the solder bar architecture lowers the temperature of semiconductor layer 18 in the device of FIG. 4B to between about 320 K and about 350 K, which lowers the average temperature by about 30 percent and equivalently the average temperature rise by about 30 percent. Furthermore, the temperature gradients are reduced because of the smaller temperature differences across die 45 and the larger area over which these changes are distributed.

Figure 5:
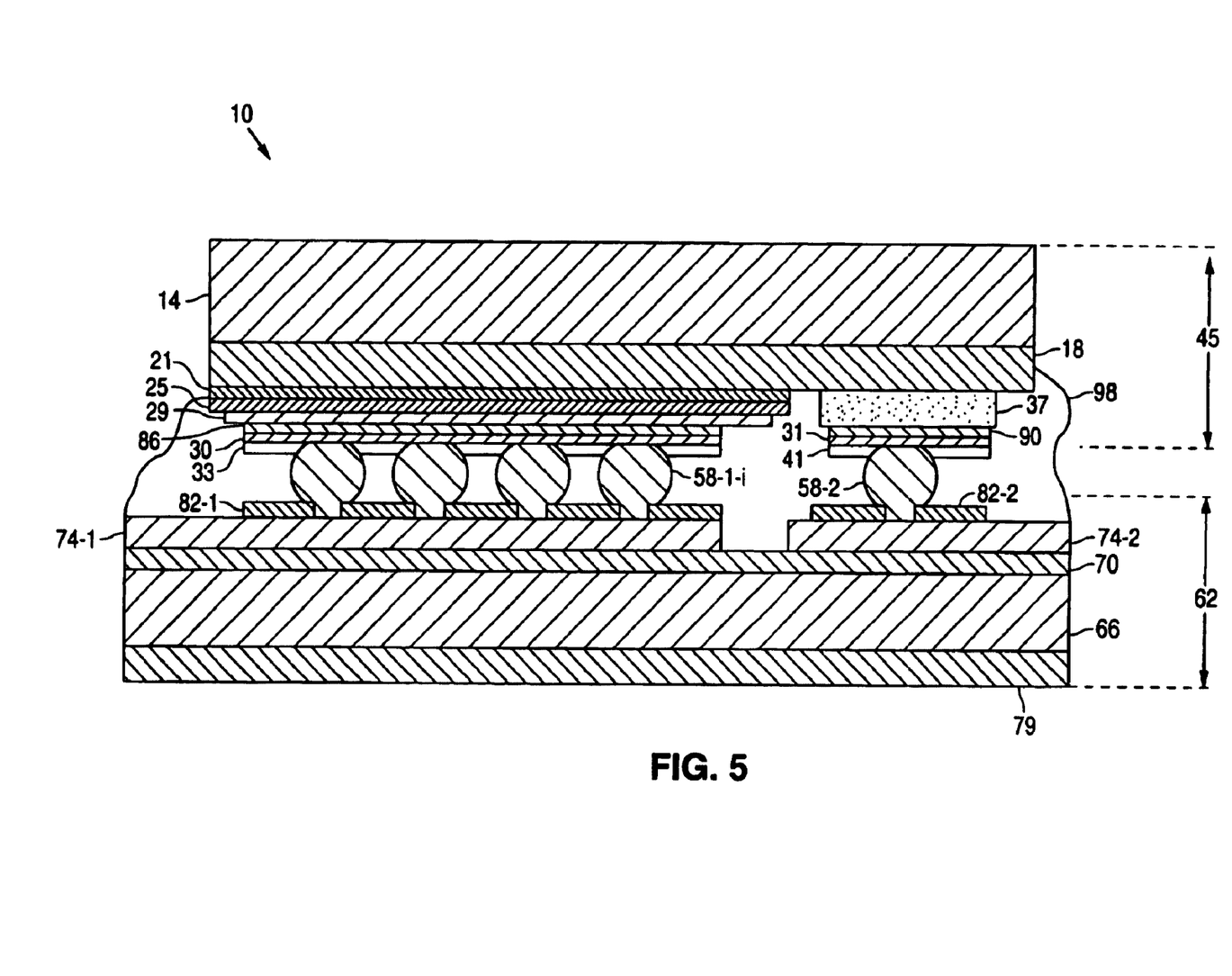
FIG. 5 illustrates an embodiment including an underfill.

FIG. 5 illustrates an embodiment of the invention which fills the unfilled portions of the region between die 45 and submount 62 with an underfill material with high thermal conductivity. The underfill material may be, for example, a gel or any other malleable material such as a paste, foam, or dust of a suitable heat conductor. Underfill 98 can be introduced into the unfilled space around solder balls 58-1-i and solder ball 58-2, or solder bars 94-j. In some embodiments, the unfilled space is filled up partially, in others the unfilled space is filled completely with underfill 98. Using underfill 98 can lead to a reduction of thermal resistance and thus a reduction of the average temperature of die 45.

Underfill 98 should have satisfactory thermal conductivity and at the same time sufficiently low electrical conductivity to avoid unwanted electrical conduction. The underfill usually has a thermal conductivity greater than about 3 W/m-K. In some embodiments, the underfill has a thermal conductivity greater than about 10 W/m-K. Materials suitable for this purpose include diamond dust, boron nitride, $TiO_2$ paste, and certain gels. An additional benefit of the embodiment is that underfill 98 prevents unwanted contaminants from entering the unfilled space of the flip chip, which could give rise to, for example, undesirable electrical pathways.

Finally, coupling the device to heat sinks, also known as "slugs," made of metals with high thermal conductivity, further reduces thermal resistances and temperature gradients at predefined locations. Metals with high thermal conductivity include Cu and Al.

Figure 7:
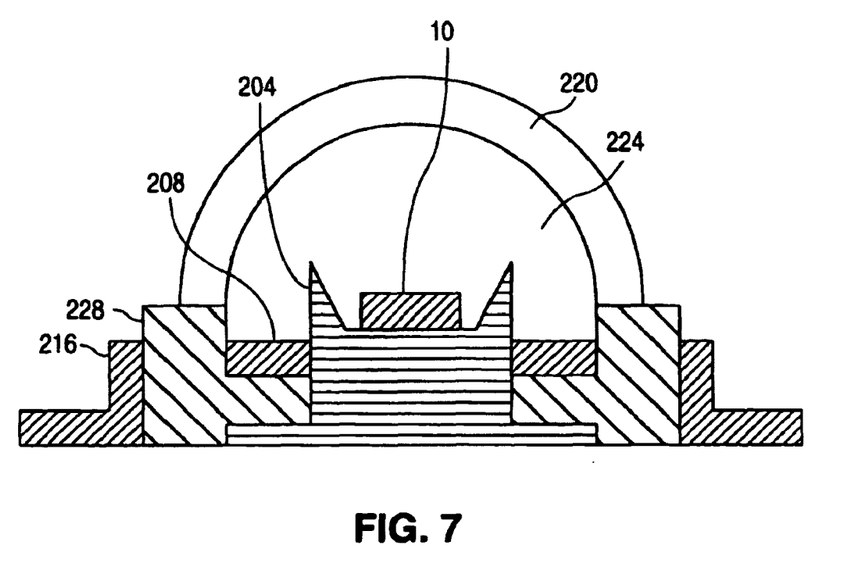
FIG. 7 illustrates a flip chip in a high power package.

FIG. 7 illustrates some embodiment of a flip chip LED 10 in a high-power package. For example, devices with an area of 1 $mm^2$ or greater are packaged in high-power packages. The high-power package includes a heat sink 204, formed from a low thermal resistance material. Heat sink 204 also serves as a reflector cup, reflecting the light emitted from LED 10 towards the base of the package. A further function of heat sink 204 is to accommodate and compensate the effects of the thermal expansion of the packaged LED's components. LED 10 is attached to heat sink 204 with solder or die-attach-epoxy. LED 10 is electrically coupled to inner leads 208 by solder balls or solder bars. Inner leads 208 are electrically coupled to outer leads 216. Inner leads 208 and outer leads 216 are formed from suitably chosen metals. Flip chip LED 10 is encapsulated into a transparent housing that includes an epoxy dome cover 220. Cover 220 may be a lens for enhanced light extraction. A soft gel 224 with high refractive index is disposed between flip chip LED 10 and epoxy dome cover 220 to enhance light extraction. The packaged flip chip LED is structurally supported by a support frame 228.

Having described the invention in detail, those skilled in the art will appreciate that, given the present disclosure, modifications may be made to the invention without departing from the spirit of the inventive concept described herein. For example, though all the examples herein show devices with the n-type layers closest to the substrate, devices according to embodiments of the invention may be fabricated with the p-type layer closest to the substrate. Therefore, it is not intended that the scope of the invention be limited to the specific embodiments illustrated and described.

What is being claimed is:

1. A light emitting device comprising:

a first semiconductor layer of a first conductivity type;

an active region overlying the first semiconductor layer, wherein the active region is capable of emitting light;

a second semiconductor layer of a second conductivity type overlying the active region;

a first contact connected to the first semiconductor layer;

a second contact connected to the second semiconductor layer;

a substrate, wherein the first semiconductor layer, second semiconductor layer and active region are connected to the substrate;

a submount;

an interconnect disposed between the submount one of the first and second contacts, wherein the interconnect physically and electrically connects the submount to one of the first and second contacts; and an underfill disposed between the submount and the active region, the underfill having a thermal conductivity greater than about 3 W/m-K;

wherein at least one of the first contact and the second contact comprises at least one metal layer having a substantially uniform thickness and a substantially uniform lateral extent, wherein the thickness is greater than 3.5 microns.

2. The device of claim 1 wherein the first semiconductor layer, active region, and second semiconductor layer are III-nitride layers, and the first and second contacts are formed on a same side of the device.

3. The device of claim 1 wherein at least one of the first contact and the second contact comprise a plurality of layers of different composition, wherein the total thickness of the plurality of layers is greater than 3.5 microns.

4. The device of claim 1 wherein at least one of the first contact and the second contact has a thickness greater than ten microns.

5. The device of claim 1 wherein both the first and second contacts have a thickness greater than 3.5 microns.

6. The device of claim 1 wherein at least one of the first contact and the second contact comprises at least one metal selected from the group consisting of Ag, Al, Au, and Cu.

7. The device of claim 1 further comprises a substrate underlying the first semiconductor layer, wherein the substrate is SiC.

8. The device of claim 1 wherein at least one of the first contact and the second contact comprises a first heat extraction layer, wherein the first heat extraction layer has a thickness greater than 0.2 micron.

9. The device of claim 8 wherein the first heat extraction layer has a thickness greater than 3.5 microns.

10. The device of claim 8 wherein the first heat extraction layer comprises at least one material selected from the group consisting of Cu, Al, Au, Ni, V, and metal alloys.

11. The device of claim 8 wherein the first heat extraction layer has an area greater than about 20 percent of an area of at least one of the first semiconductor layer and the second semiconductor layer.

12. The device of claim 1 wherein the device has an area greater than or equal to one square millimeter.

13. The device of claim 1 wherein the device has an area less than or equal to one square millimeter.

14. The device of claim 1 wherein the device has a thermal resistance per area less than about $10K/W\text{-}mm^2$ when operated at a current density of at least 143 $A/cm^2$.

15. The device of claim 1 further comprising:
a submount; and
at least one solder interconnect disposed between the submount and one of the first and second contacts, wherein a length of the solder interconnect is longer than a width of the solder interconnect.

16. The device of claim 15 wherein the solder interconnect comprises at least one material selected from the group consisting of In, Sn, metal alloys, and Ag, $In_{100-x}$, wherein x is between zero and 100.

17. The device of claim 1 further comprising:
a substrate, wherein the first semiconductor layer, second semiconductor layer and active region are connected to the substrate.

18. The device of claim 1 wherein the underfill is selected from the group consisting of diamond, boron nitride, and titanium oxide.

19. The device of claim 1 wherein the underfill fills an area greater than about 70 percent of an area of the first semiconductor layer.

20. The device of claim 1 further comprising:
a first lead electrically connected to the first contact;
a second lead electrically connected to the second contact; and
a cover disposed on a side of the first semiconductor layer opposite the active region.

21. A light emitting device comprising:
a substrate;
a first semiconductor layer of a first conductivity type overlying the substrate;
an active region overlying the first semiconductor layer, wherein the active region is capable of emitting light;
a second semiconductor layer of a second conductivity type overlying the active region;
a first contact connected to the first semiconductor layer, and
a second contact connected to the second semiconductor layer, the second contact comprising a plurality of layers including a heat extraction layer, the second contact having a thickness greater than 3.5 microns;
a submount;
an interconnect disposed between the submount and one of the first and second contacts, wherein the interconnect physically and electrically connects the submount to one of the first and second contacts and wherein the interconnect has a substantially rectangular vertical cross section; and
an underfill disposed between the submount and the substrate, the underfill having a thermal conductivity greater than about 3 W/m-K.

22. The device of claim 21 wherein the underfill substantially surrounds the interconnect.

23. The device of claim 21 wherein the interconnect comprises a solder bar.

* * * * *

UNITED STATES PATENT AND TRADEMARK OFFICE
CERTIFICATE OF CORRECTION

PATENT NO. : 6,977,396 B2
DATED : December 20, 2005
INVENTOR(S) : Yu-Chen Shen, Daniel A. Steigerwald and Paul S. Martin It is certified that error appears in the above-identified patent and that said Letters Patent is hereby corrected as shown below:

Column 9,
Line 26, replace "Ag, $In_{100-x}$," with -- $Ag_x$ $In_{100-x}$, --.

Column 10,
Line 15, replace "layer," with -- layer; --.

Signed and Sealed this

Ninth Day of May, 2006

JON W. DUDAS
*Director of the United States Patent and Trademark Office*